US008059780B2

(12) United States Patent
Wang et al.

(10) Patent No.: US 8,059,780 B2
(45) Date of Patent: Nov. 15, 2011

(54) SHIFT REGISTER CIRCUIT AND GATE DRIVING CIRCUIT

(75) Inventors: Po-Kai Wang, Hsin-Chu (TW); Chun-Hao Huang, Hsin-Chu (TW); Chung-Hung Peng, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/848,640

(22) Filed: Aug. 2, 2010

(65) Prior Publication Data
US 2011/0228894 A1    Sep. 22, 2011

(30) Foreign Application Priority Data
Mar. 19, 2010   (TW) .............................. 99108254 A

(51) Int. Cl.
*G11C 19/00* (2006.01)
(52) U.S. Cl. ................ 377/64; 377/69; 377/77; 377/78; 377/79
(58) Field of Classification Search .................. None
See application file for complete search history.

(56) References Cited

U.S. PATENT DOCUMENTS

| | | | | |
|---|---|---|---|---|
| 4,811,369 A * | 3/1989 | Barnard et al. | ................. | 377/33 |
| 5,282,234 A * | 1/1994 | Murayama et al. | ............. | 377/69 |
| 5,859,630 A | 1/1999 | Huq | | |
| 5,894,296 A | 4/1999 | Maekawa | | |
| 6,418,182 B1 * | 7/2002 | Suyama et al. | ................. | 377/69 |
| 6,778,626 B2 * | 8/2004 | Yu | ..................... | 377/69 |
| 7,366,274 B2 * | 4/2008 | Tseng et al. | .................... | 377/64 |
| 7,636,412 B2 | 12/2009 | Tobita | | |
| 7,710,384 B2 * | 5/2010 | Azami et al. | .................. | 345/100 |
| 7,746,314 B2 * | 6/2010 | Wei et al. | ....................... | 345/100 |
| 2003/0193465 A1 * | 10/2003 | Ohkawa et al. | ............... | 345/100 |
| 2006/0159217 A1 * | 7/2006 | Harada | ............................. | 377/64 |
| 2007/0086558 A1 * | 4/2007 | Wei et al. | ........................ | 377/64 |
| 2007/0217563 A1 * | 9/2007 | Chang et al. | .................... | 377/64 |
| 2009/0129535 A1 * | 5/2009 | Chen | ................................ | 377/69 |
| 2010/0260312 A1 * | 10/2010 | Tsai et al. | ....................... | 377/79 |
| 2010/0328293 A1 * | 12/2010 | Chien et al. | .................... | 345/211 |
| 2011/0044423 A1 * | 2/2011 | Lin et al. | .......................... | 377/64 |
| 2011/0058640 A1 * | 3/2011 | Shang et al. | .................... | 377/64 |

FOREIGN PATENT DOCUMENTS

CN   101645308 A   2/2010

* cited by examiner

*Primary Examiner* — Tuan T Lam
(74) *Attorney, Agent, or Firm* — WPAT, PC; Justin King

(57) ABSTRACT

An exemplary shift register circuit includes a shift register, a first switching circuit and a second switching circuit. The shift register has a start pulse signal input terminal and a start pulse signal output terminal. The first switching circuit includes a first input switch unit and a second output switch unit respectively electrically coupled to the start pulse signal input terminal and the start pulse signal output terminal. The second switching circuit includes a second input switch unit and a first output switch unit respectively electrically coupled to the start pulse signal input terminal and the start pulse signal output terminal. Moreover, on-off states of the first input and first output switch units are opposite to on-off states of the second input and second output switch units. Moreover, a gate driving circuit using the above-mentioned shift register and switching circuits also is provided.

4 Claims, 3 Drawing Sheets

SHIFT REGISTER CIRCUIT AND GATE DRIVING CIRCUIT

BACKGROUND

1. Technical Field

The present invention generally relates to display technology fields and, particularly to a shift register circuit and a gate driving circuit.

2. Description of the Related Art

Nowadays, flat display devices such as liquid crystal displays have many advantages of high display quality, small volume, lightweight and wide application range and thus are widely used in consumer electronics products such as mobile phones, laptop computers, desktop computers and televisions, etc. Moreover, the liquid crystal displays have evolved into a mainstream display in place of cathode ray tube (CRT) displays.

In order to make the display products to be more slim and more competitive at the aspect of cost, a gate driver on array (GOA) type gate driving circuit is proposed in the prior art to generate gate pulse signals. The GOA type gate driving circuit generally includes a plurality of cascade-connected shift registers directly fabricated on the substrate for sequentially outputting a plurality of gate pulse signals. The output of each of the shift registers generally also serves as a start pulse signal for next stage shift register.

However, the GOA type gate driving circuit associated with the prior art only can perform single-direction scanning and could not carry out reverse scanning, which results in the gate driving circuit lacks application flexibility.

BRIEF SUMMARY

Accordingly, the present invention is directed to a shift register circuit, which has selectable start pulse signal input/output paths.

The present invention is further directed to a gate driving circuit, can selectively perform forward scanning or reverse scanning.

More specifically, a shift register circuit in accordance with an embodiment of the present invention includes a shift register, a first switching circuit and a second switching circuit. The shift register has a start pulse signal input terminal and a start pulse signal output terminal. The first switching circuit includes a first input switch unit and a second output switch unit. The first input switch unit is electrically coupled to the start pulse signal input terminal, and the second output switch unit is electrically coupled to the start pulse signal output terminal. The second switching circuit includes a second input switch unit and a first output switch unit. The second input switch unit is electrically coupled to the start pulse signal input terminal, and the first output switch unit is electrically coupled to the start pulse signal output terminal. Moreover, on-off states of both the first input switch unit and the first output switch unit are opposite to on-off states of both the second input switch unit and the second output switch unit.

In one embodiment, the first input switch unit and the first output switch unit both are subjected to the control of a first control signal, the second input switch unit and the second output switch unit both are subjected to the control of a second control signal, the first control signal and the second control signal are phase-inverted with each other.

In one embodiment, the first input switch unit includes a first transistor. The first transistor is subjected to the control of the first control signal and for determining whether to allow an external start pulse signal to input into the shift register through the first transistor. The second output switch unit includes a second transistor. The second transistor is subjected to the control of the second control signal and for determining whether to allow an internal start pulse signal generated by the shift register to output through the second transistor. On-off states of the first transistor are opposite to on-off states of the second transistor.

In an alternative embodiment, the first input switch unit and the first output switch unit are subject to the control of two first control signals, and the second input switch unit and the second output switch unit are subject to the control of two second control signals. When the first input switch unit and the first output switch unit are the on-state, the two first control signals are phase-inverted, while the two second control signals are fixed to a same constant voltage level. When the second input switch unit and the second output switch unit are the on-state, the two second control signals are phase-inverted, while the two first control signals are fixed to a same constant voltage level. Moreover, the first input switch unit can include two first transistors, the two first transistors respectively are subjected to the control of the two first control signals through two diode-connected transistors and thereby alternately determining to whether allow an external start pulse signal to input into the shift register through the first input switch unit. The second output switch unit can include two second transistors, the two second transistors respectively are subjected to the control of the two second control signals through two diode-connected transistors and thereby alternately determining to whether allow an internal start pulse signal generated by the shift register to output through the second output switch unit.

In one embodiment, the shift register includes a control circuit, an output circuit and a pull down circuit. The control circuit is electrically coupled to the start pulse signal input terminal to receive an external start pulse signal inputted through the first input switch unit or the second input switch unit and further for outputting an enable signal from an output terminal of the control circuit according to the external start pulse signal. The output circuit is electrically coupled to the output terminal of the control circuit and subjected to the control of the enable signal to output an internal start pulse signal. The pull down circuit is for pulling a potential at the output terminal of the control circuit and another potential at an output terminal of the output circuit for outputting the internal start pulse signal down to a predetermined potential.

In one embodiment, logic low levels of the first and second control signals are lower than the predetermined potential.

In one embodiment, the shift register further includes a reset circuit for resetting the potential at the output terminal of the control circuit and the potential at the output terminal of the output circuit for outputting the internal start pulse signal.

A gate driving circuit in accordance with another embodiment of the present invention includes a plurality of switching circuits and a plurality of shift registers connected in cascade. Each of the shift registers includes a start pulse signal input terminal and start pulse signal output terminal. Each adjacent two of the shift registers are electrically coupled with each other through a designated one of the switching circuits. The designated switching circuit includes a first switch unit and a second switch unit. The first switch unit is electrically coupled between the start pulse signal output terminal of a first one of the adjacent two shift registers and the start pulse signal input terminal of a second one of the adjacent two shift registers. The second switch unit is electrically coupled between the start pulse signal input terminal of the first one and the start pulse signal output terminal of the second one.

Moreover, on-off states of the first switch unit are opposite to on-off states of the second switch unit.

In one embodiment, the first switch unit is subjected to the control of a first control signal, the second switch unit is subjected to the control of a second control signal, and the first control signal and the second control signal are phase-inverted with each other. More specifically, the first switch unit can include a first transistor. The drain/source of the first transistor is electrically coupled to the start pulse signal output terminal of the first one, the source/drain of the first transistor is electrically coupled to the start pulse signal input terminal of the second one, and the gate of the first transistor is electrically coupled to receive the first control signal. The second switch unit can include a second transistor. The drain/source of the second transistor is electrically coupled to the start pulse signal input terminal of the first one, the source/drain of the second transistor is electrically coupled to the start pulse signal output terminal of the second one, and the gate of the second transistor is electrically coupled to receive the second control signal. On-off states of the first transistor are opposite to on-off states of the second transistor.

In an alternative embodiment, the first switch unit is subjected to the control of two first control signals, the second switch unit is subjected to the control of two second control signals. When the first switch unit is in the on-state, the two first control signals are phase-inverted, while the two second control signals are fixed to a same constant voltage level. When the second switch unit is in the on-state, the two second control signals are phase-inverted, while the two first control signals are fixed to a same constant voltage level. Moreover, the first switch unit comprises two first transistors, the drains/sources of the two first transistors are electrically coupled to the start pulse signal output terminal of the first one, the sources/drains of the two first transistors are electrically coupled to the start pulse signal input terminal of the second one, and the gates of the two first transistors are respectively electrically coupled to the two first control signals through two diode-connected transistors. The second switch unit comprises two second transistors, the drains/sources of the two second transistors are electrically coupled to the start pulse signal input terminal of the first one, the sources/drains of the two second transistors are electrically coupled to the start pulse signal output terminal of the second one, and the gates of the two second transistors are respectively electrically coupled to receive the two second control signals through two diode-connected transistors.

In one embodiment, the gate driving circuit further includes a second switching circuit. The second switching circuit is electrically coupled to the start pulse signal input terminal of the first stage of the cascade-connected shift registers and the start pulse signal input terminal of the last stage of the cascade-connected shift registers. The second switching circuit is for allowing a start pulse signal selectively to be inputted into the first stage shift register or the last stage shift register.

In summary, the above-mentioned embodiments of the present invention employs added switching circuits to determine the input/output path of start pulse signal in the shift register circuit, so that the transmission direction of the start pulse signal can be flexibly selected. When the shift register circuit is applied to a gate driving circuit, the gate driving circuit can meet the requirement of forward scanning and reverse scanning, so that the application flexibility thereof is improved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

In the following detailed description of the preferred embodiments, reference is made to the accompanying drawings which form a part hereof, and in which are shown by way of illustration specific embodiments in which the invention may be practiced. In this regard, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "coupled" and variations thereof herein are used broadly and encompass direct and indirect connections, and couplings. Accordingly, the drawings and descriptions will be regarded as illustrative in nature and not as restrictive.

Figure 1:
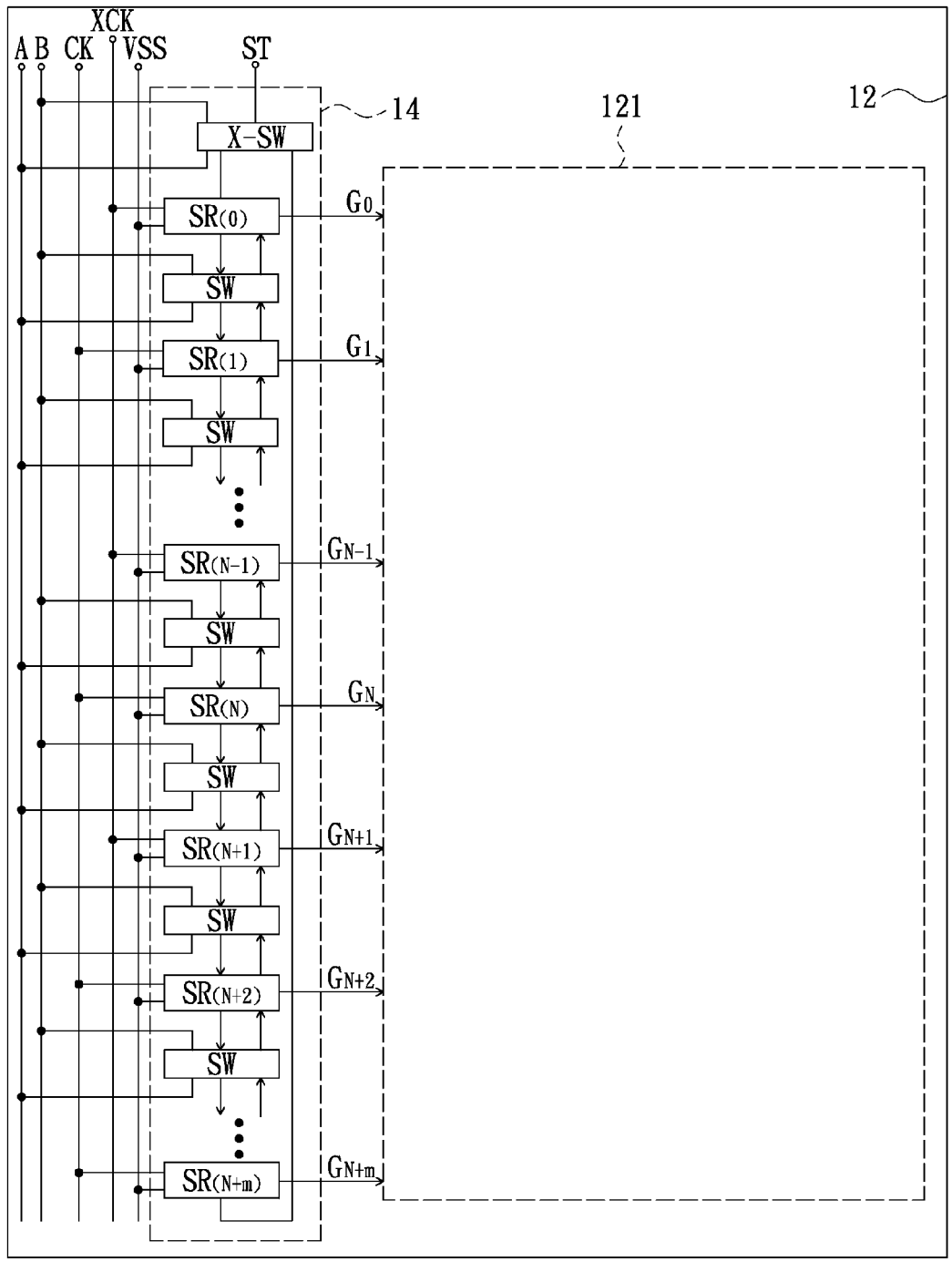
FIG. 1 shows a schematic partial structural diagram of a display device in accordance with an embodiment of the present invention.

Referring to FIG. 1, showing a schematic partial structural diagram of a display device in accordance with an embodiment of the present invention. As illustrated in FIG. 1, the display device 10 includes a display substrate 12 and a gate driving circuit 14 formed on the display substrate 12. Herein, the display substrate 12 has a thin film transistor array 121 formed thereon. The gate driving circuit 14 is for sequentially generating gate driving signals to scan the thin film transistor array 121.

Specifically, the gate driving circuit 14 includes a plurality of switching circuits SW, a plurality of shift registers SR(0)~SR(N+m) and another switching circuit X-SW, N and m both are positive integers, N is larger than 1 and m is larger than 0. The shift registers SR(0)~SR(N+m) are electrically coupled with one another in cascade, and each adjacent two of the shift registers SR(0)~SR(N+m) are electrically coupled with each other through a designated one switching circuit SW. An input terminal of the switching circuit X-SW is electrically coupled to receive an external start pulse signal ST, and two output terminals of the switching circuit X-SW respectively are electrically coupled to the first stage shift register SR(0) and the last stage shift register SR(N+m).

The shift registers SR(0)~SR(N+m) are electrically coupled to clock pulse signals CK, XCK and a power supply potential VSS. The clock pulse signals CK and XCK are phase-inverted with each other. Herein, the gate driving circuit 14 uses two-phase clock pulse signals, but it is not to limit the present invention. The switching circuit X-SW and the switching circuits SW are subjected to the control of control signals A, B to determine the input/output path of start pulse signal for each of the shift registers SR(0)~SR(N+m). The control signals A and B are phase-inverted with each other. An example is taken for the purpose of illustration as follows: when the control signal A is logic high, the control signal B is logic low, the external start pulse signal ST is directed to the shift register SR(0) through the switching circuit X-SW rather than the shift register SR(N+m), the gate driving circuit 14 will sequentially generate gate driving signals $G_0 \sim G_{N+m}$ for performing a forward scanning; whereas, when the control signal B is logic high, the control signal A is logic low, the external start pulse signal ST will be directed to the shift register SR(N+m) through the switching circuit X-SW rather than the shift register SR(0), the gate driving circuit 14 will sequentially generate $G_{N+m} \sim G_0$ for performing a reverse scanning. In other words, the gate driving circuit 14 can be flexibly switched to perform forward scanning or reverse scanning by chaing the logic levels of the control signals A, B.

Detailed circuit configurations of the switching circuits SW and the shift registers SR(0)~SR(N+m) will be described below with reference to FIG. 2. In the illustrated embodiment, since the circuit configurations of the switching circuits SW are the same with one another, and the circuit configurations of the shift registers SR(0)~SR(N+m) also are the same with one another, FIG. 2 only illustrates the circuit configurations of one shift register SR(N) and two switching circuits SW for the purpose of illustration. For the convenience of description, the two switching circuits SW in FIG. 2 respectively are labeled as SW-a and SW-b, the circuit constituted by the shift register SR(N) and the switching circuits SW-a, SW-b in FIG. 2 is termed as shift register circuit.

Figure 2:
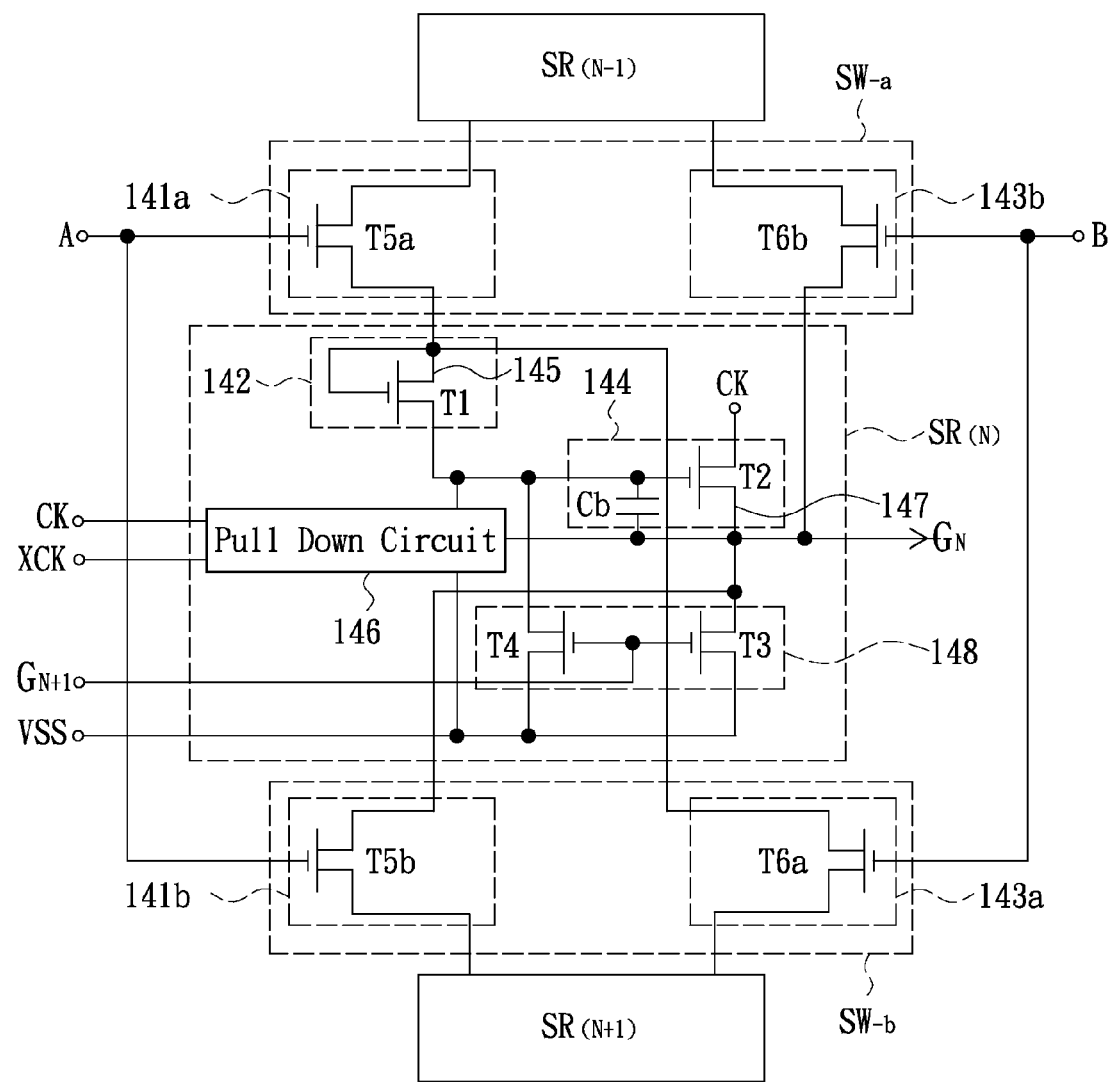
FIG. 2 shows a schematic circuit diagram of a shift register circuit in accordance with an embodiment of the present invention.

As illustrated in FIG. 2, the shift register SR(N) has a start pulse signal input terminal 145 and a start pulse signal output terminal 147. In the illustrated embodiment, the shift register SR(N) further includes a control circuit 142, an output circuit 144, a pull down circuit 146 and a reset circuit 148.

The control circuit 142 includes a transistor T1. The drain/source of the transistor T1 is electrically coupled to the start pulse signal input terminal 145, the source/drain of the transistor t1 outputs an enable signal when the transistor T1 is switched on, and the gate of the transistor T1 is electrically coupled to the drain/source of the transistor T1. In other words, the transistor T1 is connected in a diode manner, but not to limit the present invention, for example the control circuit 142 can include a plurality of transistors and the transistors are electrically connected in a cascade manner. The output circuit 144 includes a transistor T2 and a storage capacitor Cb. The gate of the transistor T2 is electrically coupled to the source/drain of the transistor T1 and thereby subjected to the control of the enable signal, the drain/source of the transistor T2 is electrically coupled to receive the clock pulse signal CK, and the source/drain of the transistor T2 serves as an output terminal of the gate driving signal $G_N$ as well as the start pulse signal output terminal 147, but it is not to limit the present invention, for example an additional transistor can be given in the output circuit 144 to output the start pulse signal. The storage capacitor Cb is electrically coupled between the gate of the transistor T2 and the source/drain of the transistor T2. The pull down circuit 146 is electrically coupled with the clock pulse signals CK, XCK and the power supply potential VSS, and further electrically coupled to the source/drain of the transistor T1 and the source/drain of the transistor T2. The pull down circuit 146 is for pulling a potential at the source/drain of the transistor T1 and another potential at the source/drain of the transistor T2 down to a predetermined potential e.g., the power supply potential VSS. The reset circuit 148 includes transistors T3 and T4, but it is not to limit the present invention. The gate of the transistor T3 is electrically coupled with the gate of the transistor T4 and both are subjected to the control of a gate driving signal $G_{N+1}$ generated by next stage shift register e.g., SR(N+1). The drain/source of the transistor T3 is electrically coupled to the source/drain of the transistor T2, the drain/source of the transistor T4 is electrically coupled to the source/drain of the transistor T1, and the sources/drains of the transistors T3, T4 both are electrically coupled to a predetermined potential e.g., the power supply potential VSS. Herein, the reset circuit 148 is for resetting the potential at the source/drain of the transistor T1 and the potential at the source/drain of the transistor T2.

The switching circuit SW-a includes an input switch unit 141a and an output switch unit 143b. On-off states of the input switch unit 141a are opposite to on-off states of the output switch unit 143b. The input switch unit 141a is electrically coupled between the start pulse signal output terminal of the shift register SR(N−1) and the start pulse signal input terminal 145 of the shift register SR(N), i.e., for determining whether to allow an external start pulse signal to input into the shift register SR(N). The output switch unit 143b is electrically coupled between the start pulse signal input terminal of the shift register SR(N−1) and the start pulse signal output terminal 147 of the shift register SR(N), i.e., for determining whether to allow an internal start pulse signal generated by the shift register SR(N) to output to the shift register SR(N−1). More specifically, the input switch unit 141a includes a transistor T5a. The gate of the transistor T5a is electrically coupled to receive the control signal A, herein the logic low level of the control signal A is lower than the power supply potential VSS, the drain/source of the transistor T5a is for receiving an external start pulse signal, and the source/drain of the transistor T5a is electrically coupled to the start pulse signal input terminal 145 of the shift register SR(N). The output switch unit 143b includes a transistor T6b. The gate of the transistor T6b is electrically coupled to receive the control signal B, herein the logic low level of the control signal B is lower than the power supply potential VSS, the drain/source of the transistor T6b outputs the internal start pulse signal when the transistor T6b is switched on, and the source/drain of the transistor T6b is electrically coupled to the start pulse signal output terminal 147 of the shift register SR(N). Herein, the on-off states of the transistor T5a are opposite to the on-off states of the transistor T6b.

The switching circuit SW-b includes an output switch unit 141b and an input switch unit 143a. On-off states of the output switch unit 141b are opposite to on-off states of the input switch unit 143a. The output switch unit 141b is electrically coupled between the start pulse signal output terminal 147 of the shift register SR(N) and the start pulse signal input terminal of the shift register SR(N+1), i.e., for determining whether to allow the internal start pulse signal generated by the shift register SR(N) to output to the shift register SR(N+1). The input switch unit 143a is electrically coupled between the start pulse signal input terminal 145 of the shift register SR(N) and the start pulse signal output terminal of the shift register SR(N+1), i.e., for determining whether to allow an external start pulse signal to input into the shift register SR(N). More specifically, the output switch unit 141b includes a transistor T5b. The gate of the transistor T5b is electrically coupled to receive the control signal A, the drain/source of the transistor T5b is electrically coupled to the start pulse signal output terminal 147 of the shift register SR(N), and the source/drain of the transistor T5b outputs the internal start pulse signal when the transistor T5b is switched on. The input switch unit 143a includes a transistor T6a. The gate of the transistor T6a is electrically coupled to receive the control signal B, the drain/source of the transistor T6a is electrically coupled to the start pulse signal input terminal 145 of the shift register SR(N), and the source/drain of the transistor T6a is for receiving an external start pulse signal. Herein, on-off states of the transistor T6a are opposite to on-off states of the transistor T6b.

In the illustrated embodiment, the input switch unit 141a and the output switch unit 141b constitute a start pulse signal input/output path, the input switch unit 143a and the output switch unit 143b constitute another start pulse signal input/output path. Furthermore, the input switch units 141a, 143a and the output switch units 141b, 143b each are not limited to include single transistor, and can include a plurality of transistors connected in a suitable manner.

In addition, in regard to the switching circuit X-SW, a detail circuit configuration thereof is similar to that of each the switching circuit SW, the difference is that: the two switch units in the switching circuit X-SW both are input switch units for selectively providing the external start pulse signal ST to one of the shift register SR(0) and the shift register SR(N+m).

Figure 3:
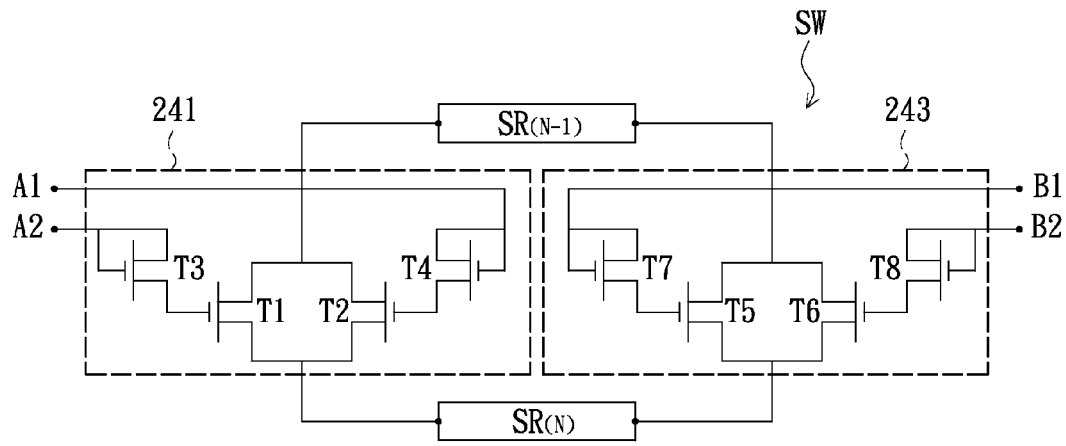
FIG. 3 shows a schematic circuit diagram of a switching circuit in accordance with another embodiment of the present invention.

It is indicated that the switching circuits SW in the gate driving circuit 14 cannot be limited to the given circuit configuration as illustrated in FIG. 2, and may have other circuit configuration such as the illustration of FIG. 3 to achieve the purpose of slowing down the speed of threshold voltage shifting of the switching circuit.

Referring to FIG. 3, it shows a schematic circuit diagram of the switching circuit SW in accordance with another embodiment of the present invention. As illustrated in FIG. 3, the switching circuit SW is arranged between the two adjacent shift registers SR(N-1) and SR(N) and includes switch units 241 and 243. In particular, the switch unit 241 is subject to the control of control signals A1, A2 and includes transistors T1~T4. The drains/sources of the transistors T1, T2 are electrically coupled to the start pulse signal output terminal of the shift register SR(N-1), the sources/drains of the transistors T1, T2 are electrically coupled to the start pulse signal input terminal of the shift register SR(N), and the gates of the transistors T1, T2 are respectively electrically coupled to receive the control signals A2, A1 through the respective diode-connected transistors T3, T4. Similarly, the switch unit 243 is subject to the control of control signals B1, B2 and includes transistors T5~T8. The drains/sources of the transistors T5, T6 are electrically coupled to the start pulse signal input terminal of the shift register SR(N-1), the sources/drains of the transistors T5, T6 are electrically coupled to the start pulse signal output terminal of the shift register SR(N), and the gates of the transistors T5, T6 are respectively electrically coupled to receive the control signals B1, B2 through the respective diode-connected transistors T7, T8.

Figure 4A:
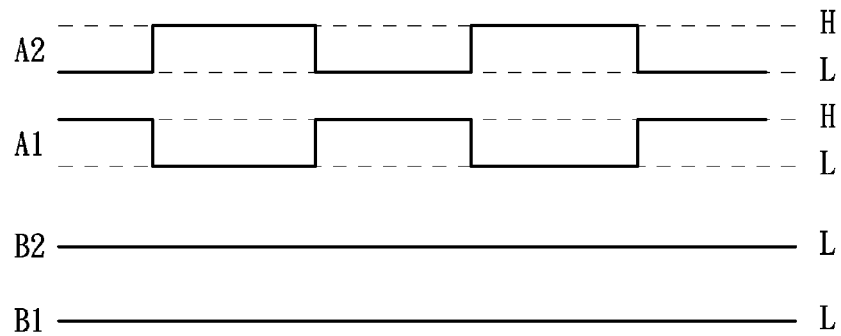
FIG. 4A and FIG. 4B show timing diagrams of multiple control signals in FIG. 3.
Figure 4B:
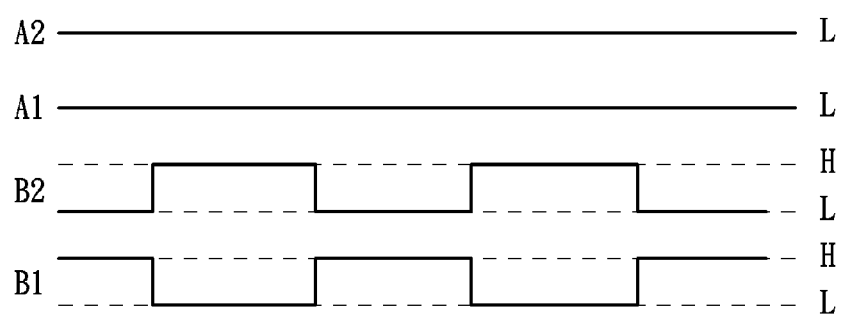

In the following, an operation principle of the switching circuit SW as illustrated in FIG. 3 will be described in detail with reference to FIGS. 4A and 4B. When a forward scanning is selected to be performed, i.e., allowing the shift register SR(N-1) to provide a start pulse signal to the shift register SR(N), the control signals A1 and A2 are phase-inverted with respect to each other to enable the transistors T1, T2 to be alternately switched-on and thereby the switch unit 241 continuously is on-state. As a result, the start pulse signal from the shift register SR(N-1) is directed to the shift register SR(N) through the switch unit 241. Meanwhile, the control signals B1, B2 are fixed to a same constant voltage level, e.g., logic low level L as illustrated in FIG. 4A, so that the switch unit 243 is kept at off-state.

Whereas, When a reverse scanning is selected to be performed, i.e., allowing the shift register SR(N) to provide a start pulse signal to the shift register SR(N-1), the control signals B1 and B2 are phase-inverted with respect to each other to enable the transistors T5, T6 to be alternately switched-on and thereby the switch unit 243 continuously is on-state. As a result, the start pulse signal from the shift register SR(N) is directed to the shift register SR(N-1) through the switch unit 243. Meanwhile, the control signals A1, A2 are fixed to a same constant voltage level, e.g., logic low level L as illustrated in FIG. 4B, so that the switch unit 241 is kept at off-state.

In summary, the above-mentioned embodiments of the present invention employs added switching circuits to determine the input/output path of start pulse signal in the shift register circuit, so that the transmission direction of the start pulse signal can be flexibly selected. When the shift register circuit is applied to a gate driving circuit, the gate driving circuit can meet the requirement of forward scanning and reverse scanning, so that the application flexibility thereof is improved. Additionally, the shift register circuit in accordance with the present invention is not limited to be applied in the gate driving circuit, and can be applied other circuit for example a source driving circuit of display device.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A shift register circuit comprising:
    a shift register, having a start pulse signal input terminal and a start pulse signal output terminal;
    a first switching circuit, comprising a first input switch unit and a second output switch unit, wherein the first input switch unit is electrically coupled to the start pulse signal input terminal, and the second output switch unit is electrically coupled to the start pulse signal output terminal; and
    a second switching circuit, comprising a second input switch unit and a first output switch unit, wherein the second input switch unit is electrically coupled to the start pulse signal input terminal, and the first output switch unit is electrically coupled to the start pulse signal output terminal;
    wherein on-off states of both the first input switch unit and the first output switch unit are opposite to on-off states of both the second input switch unit and the second output switch unit; and
    wherein:
        the first input switch unit and the first output switch unit are subject to the control of two first control signals, and the second input switch unit and the second output switch unit are subject to the control of two second control signals;
        when the first input switch unit and the first output switch unit are the on-state, the two first control signals are phase-inverted, while the two second control signals are fixed to a same constant voltage level; and
        when the second input switch unit and the second output switch unit are the on-state, the two second control signals are phase-inverted, while the two first control signals are fixed to a same constant voltage level.

2. The shift register circuit as claimed in claim 1, wherein:
the first input switch unit comprises two first transistors, the two first transistors respectively are subjected to the control of the two first control signals through two diode-connected transistors and thereby alternately determining to whether allow an external start pulse signal to input into the shift register through the first input switch unit; and
the second output switch unit comprises two second transistors, the two second transistors respectively are subjected to the control of the two second control signals through two diode-connected transistors and thereby alternately determining to whether allow an internal start pulse signal generated by the shift register to output through the second output switch unit.

3. A gate driving circuit comprising:
a plurality of switching circuits; and
a plurality of shift registers connected in cascade, wherein each of the shift registers comprises a start pulse signal input terminal and a start pulse signal output terminal, each adjacent two of the shift registers are electrically coupled with each other through a designated one of the switching circuits, and the designated switching circuit comprises:
   a first switch unit, electrically coupled between the start pulse signal output terminal of a first one of the adjacent two shift registers and the start pulse signal input terminal of a second one of the adjacent two shift registers; and
   a second switch unit, electrically coupled between the start pulse signal input terminal of the first one and the start pulse signal output terminal of the second one;
wherein on-off states of the first switch unit are opposite to on-off states of the second switch unit; and
wherein:
   the first switch unit is subjected to the control of two first control signals, the second switch unit is subjected to the control of two second control signals;
   when the first switch unit is in the on-state, the two first control signals are phase-inverted, while the two second control signals are fixed to a same constant voltage level; and
   when the second switch unit is in the on-state, the two second control signals are phase-inverted, while the two first control signals are fixed to a same constant voltage level.

4. The gate driving circuit as claimed in claim 3, wherein:
the first switch unit comprises two first transistors, the drains/sources of the two first transistors are electrically coupled to the start pulse signal output terminal of the first one, the sources/drains of the two first transistors are electrically coupled to the start pulse signal input terminal of the second one, and the gates of the two first transistors are respectively electrically coupled to the two first control signals through two diode-connected transistors; and
the second switch unit comprises two second transistors, the drains/sources of the two second transistors are electrically coupled to the start pulse signal input terminal of the first one, the sources/drains of the two second transistors are electrically coupled to the start pulse signal output terminal of the second one, and the gates of the two second transistors are respectively electrically coupled to receive the two second control signals through two diode-connected transistors.

* * * * *